United States Patent
Zhao et al.

(10) Patent No.: US 9,693,461 B2
(45) Date of Patent: Jun. 27, 2017

(54) MAGNETIC-CORE THREE-DIMENSIONAL (3D) INDUCTORS AND PACKAGING INTEGRATION

(71) Applicant: BROADCOM CORPORATION, Irvine, CA (US)

(72) Inventors: Sam Ziqun Zhao, Irvine, CA (US); Edward Law, Ladera Ranch, CA (US); Sampath Komarapalayam Karikalan, Irvine, CA (US); Neal Andrew Kistler, Laguna Niguel, CA (US); Rezaur Rahman Khan, Irvine, CA (US); Pieter Vorenkamp, Laguna Niguel, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 128 days.

(21) Appl. No.: 14/684,256

(22) Filed: Apr. 10, 2015

(65) Prior Publication Data

US 2015/0302974 A1    Oct. 22, 2015

Related U.S. Application Data

(60) Provisional application No. 62/114,489, filed on Feb. 10, 2015, provisional application No. 62/062,716, (Continued)

(51) Int. Cl.
*H01F 5/00* (2006.01)
*H05K 1/18* (2006.01)
(Continued)

(52) U.S. Cl.
CPC ......... *H05K 1/181* (2013.01); *H01F 17/0013* (2013.01); *H01F 41/046* (2013.01); (Continued)

(58) Field of Classification Search
USPC ................................. 361/270; 336/200, 223
See application file for complete search history.

(56) References Cited

U.S. PATENT DOCUMENTS 5,070,317 A  *  12/1991  Bhagat .................. B81B 7/0077
                                             257/531
5,576,680 A  *  11/1996  Ling .................... H01F 17/0033
                                             257/E21.022

(Continued)

FOREIGN PATENT DOCUMENTS

| CN | 101071679 A | 11/2007 |
| CN | 102474109 A | 5/2012 |
| JP | 2004-296816 A | 10/2004 |

*Primary Examiner* — Danny Nguyen
(74) *Attorney, Agent, or Firm* — McDermott Will & Emery LLP

(57) ABSTRACT

A 3-dimensional (3-D) magnetic core device includes a substrate, a first magnetic shell formed on the substrate, and a first group of conductive traces embedded in a first insulator layer formed on the first magnetic shell. A magnetic core plane is formed on the first insulator layer, and a second group of conductive traces are embedded in a second insulator layer formed on the magnetic core plane. A second magnetic shell is formed on the second insulator layer, and the first and second group of conductive traces are conductively coupled by using conductive vias.

24 Claims, 16 Drawing Sheets

Related U.S. Application Data filed on Oct. 10, 2014, provisional application No. 61/980,565, filed on Apr. 16, 2014.

(51) Int. Cl.
  *H01F 17/00* (2006.01)
  *H01F 41/04* (2006.01)
  *H01F 27/28* (2006.01)
  *H01F 17/04* (2006.01)
  *H01F 38/14* (2006.01)

(52) U.S. Cl.
  CPC ............ *H01F 17/045* (2013.01); *H01F 38/14* (2013.01); *H01F 2017/0053* (2013.01); *H01F 2017/0066* (2013.01); *H01F 2027/2809* (2013.01)

(56) References Cited

U.S. PATENT DOCUMENTS

| | | |
|---|---|---|
| 2004/0164839 A1 | 8/2004 | Park et al. |
| 2006/0267718 A1* | 11/2006 | Salama ............... H01F 17/0033 336/200 |
| 2007/0230042 A1 | 10/2007 | Fujiwara |
| 2008/0198560 A1 | 8/2008 | Fujiwara et al. |
| 2013/0056847 A1 | 3/2013 | Chen |

* cited by examiner

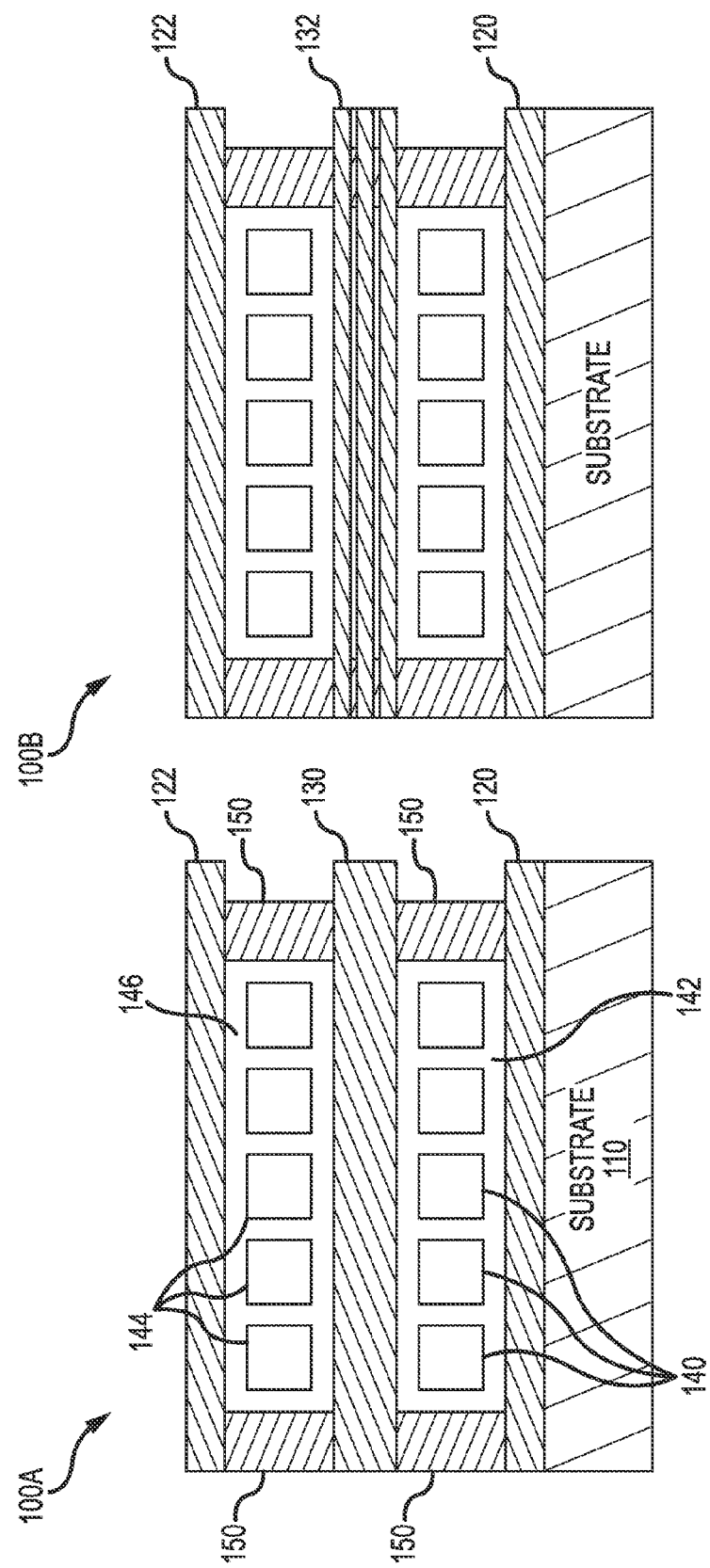

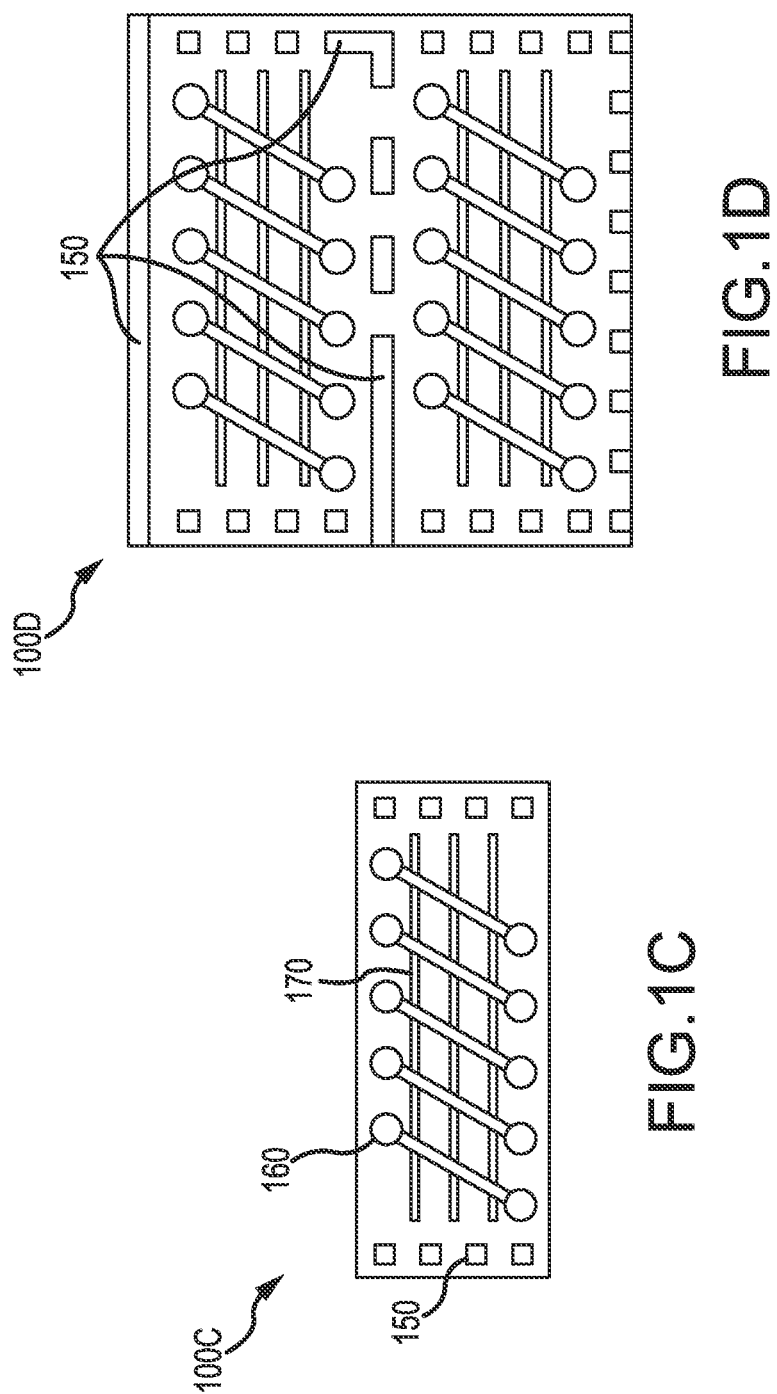

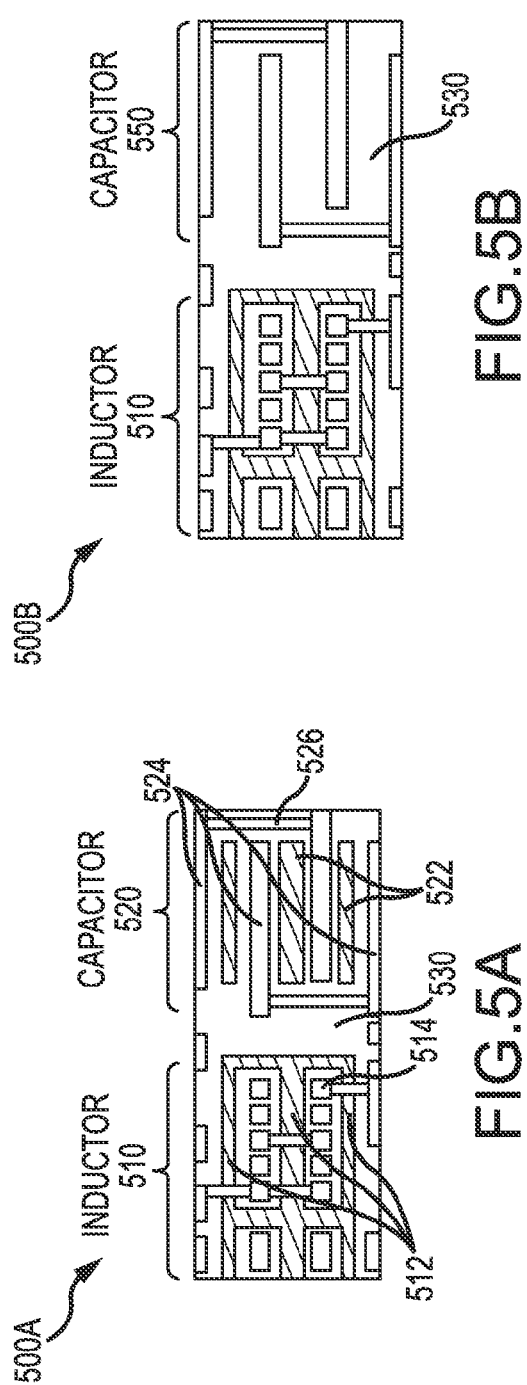
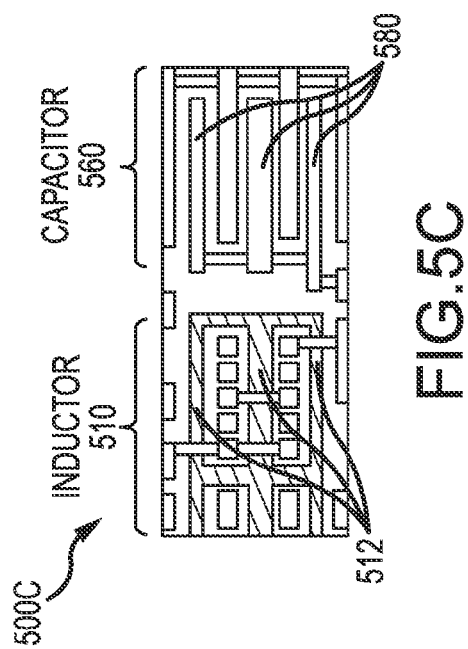
FIG.5A
FIG.5B
FIG.5C

600A
LC RESONANT CIRCUIT
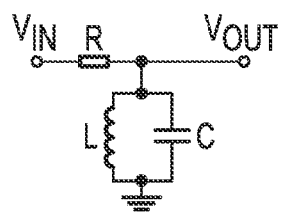
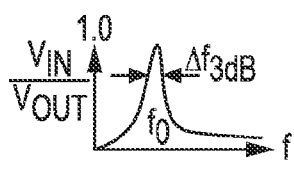
FIG.6A
600B
LC TRAP CIRCUIT
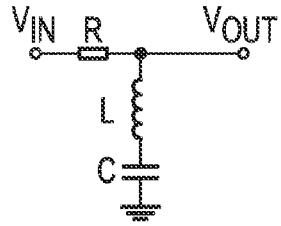
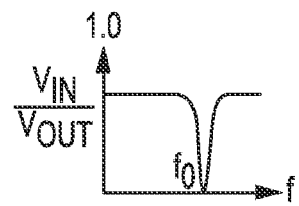
FIG.6B
600C
LC LOW PASS FILTER
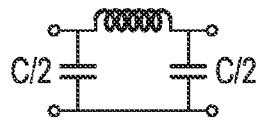
PI SECTION FILTER
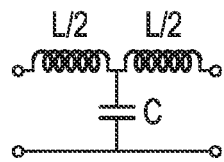
T SECTION FILTER
FIG.6C

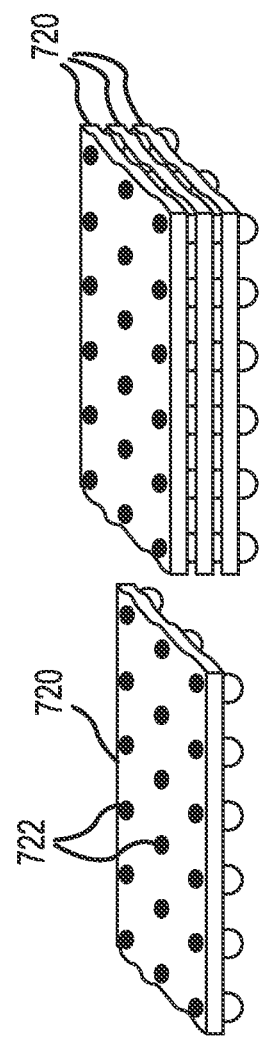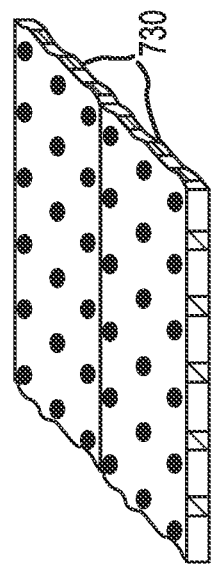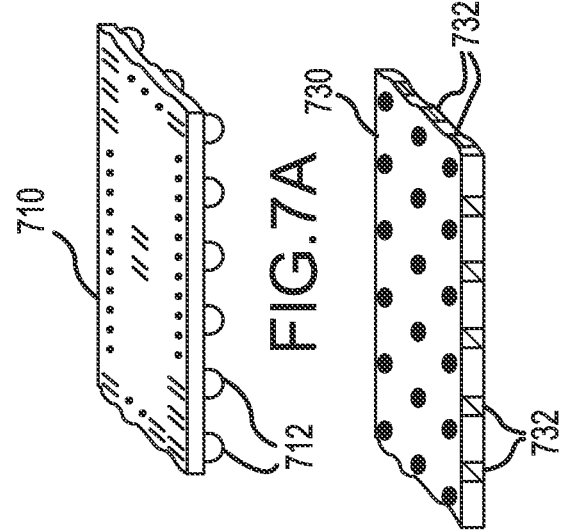

MAGNETIC-CORE THREE-DIMENSIONAL (3D) INDUCTORS AND PACKAGING INTEGRATION

CROSS-REFERENCE TO RELATED APPLICATIONS

This application claims the benefit of priority under 35 U.S.C. §119 from U.S. Provisional Patent Applications 61/980,565, filed Apr. 16, 2014, 62/062,716, filed Oct. 10, 2014, and 62/114,489, filed Feb. 10, 2015, which are incorporated herein by reference in their entirety.

TECHNICAL FIELD

The subject technology generally relates to integrated circuits and, in particular, relates to magnetic-core three-dimensional (3D) inductors and packaging integration.

BACKGROUND

Inductors are placed in circuits with one or more semiconductor devices, for performing actions such as filtering and RF matching. An inductor usually contains one or more turns of a conductor, around an air core or magnetic core, and the value of the inductance is directly proportional to the amount of the magnetic field coupled to the turns of the conductor due to an alternating current flowing through that conductor. Small value inductors, which do not require a large area, can be realized on-die a silicon chip, to reduce the BOM and to save on the real-estate on printed circuit boards (PCBs). Such inductors can also be patterned on the metal layers of an IC packaging substrate and connected to the circuitry on-die with a path with low electrical parasitics. However, when the value of the inductance needed is large (e.g., in a bulk inductor at the output of a voltage regulator), such on-die or on-substrate metal patterns with a non-magnetic medium surrounding them, could be cost prohibitive or practically impossible within the die structure.

Magnetic core material is used in surface mount discrete inductors, over which wires are wound, for realizing high value inductors for applications such as power supply filtering. Such magnetic core inductors are often placed on a PCB, side-by-side with the semiconductor device, due to their large footprint and thickness. Low profile magnetic core inductors are gradually becoming available for surface mounting on the top layer of the IC packaging substrate, side-by-side with the silicon die. However, their footprint may still cause the IC packaging substrate size to grow.

Radio frequency (RF) circuits including RF transceivers may utilize high quality passive devices such as inductors. For example, integrated passive devices (IPDs) can be used as surface mount integrated circuits. Using inductors as surface mount devices, however, may necessitate additional surface mount technology (SMT) process steps, and may lead to a larger sized interposer, resulting in an increased cost. For example, additional surface area on a touch-sensitive interface (TSI) surface for surface mounting passive components, and/or the use of special soldering process for mounting small (e.g., <0.4×0.4×0.4 mm) passive components may be unavoidable.

Air core inductors on TSI redistribution layer (RDL) metals may have a low Q-factor (e.g., ~10-25 for inductance range ~1-10 nH at 2 GHz) and a high cost due to deep via etch and fill on silicon wafer, and, planar spiral inductors may be costly due to the high cost of RDL metal layer. High current inductors may typically be in the form of bulky discrete components and located on PCB or package substrate. However, the large current needed to feed the PCB or substrate traces connected to the chip power supplier pins may cause issues with power loss and power supply integrity.

BRIEF DESCRIPTION OF THE DRAWINGS

Certain features of the subject technology are set forth in the appended claims. However, for purpose of explanation, several embodiments of the subject technology are set forth in the following figures.

FIGS. 1A-1B illustrate cross-sectional views of example structures of uncoupled magnetic core devices having a 3-dimensional (3-D) helical coil and a 3-D magnetic-flux closed circuit in accordance with one or more implementations.

FIGS. 1C-1D illustrate additional cross-sectional views of the example structures of uncoupled magnetic core device of FIG. 1A in accordance with one or more implementations.

FIGS. 5A through 5C illustrate examples of integrated inductor and capacitor filters in accordance with one or more implementations.

FIGS. 6A through 6D illustrate examples of applications of a 3-D magnetic core device in accordance with one or more implementations.

FIGS. 7A through 7E illustrate examples of integrated inductors and capacitors into a passive device package (PDP) in accordance with one or more implementations.

DETAILED DESCRIPTION

Figure 2B:
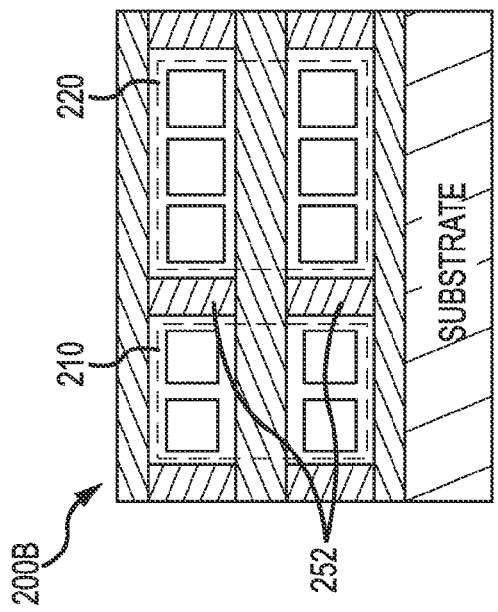
FIGS. 2A through 2C illustrate cross-sectional views of example structures of a magnetic core device including coupled inductors in accordance with one or more implementations.

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and can be practiced using one or more implementations. In one or more instances, well-known structures and components are shown in block diagram form in order to avoid obscuring the concepts of the subject technology.

In one or more aspects of the subject technology, methods and implementations for providing magnetic core 3D inductors and an interposer having integrated 3D inductor circuits are described. The subject technology may be employed in various applications such as voltage regulator circuits, RF circuits, power-delivery network voltage-droop suppression circuits, wireless charging devices, energy harvesting, and other applications. Existing coupled-magnetic-core inductors on Si-interposer may be implemented on a top surface of an interposer to allow for high-current inductors to be located underneath flip chip power delivery pins. The existing solutions, however, may provide limited inductor density on a given interposer due to the amount of surface area required by both the copper conductor and the inductor yoke. The existing solutions may also utilize bulky coils due to their two-dimensional (2D) structure. The disclosed technology allows implementations that utilize 3D inductor coils that can minimize the surface footprint and enable high energy density inductors, with high (e.g., >100) Q-factor values.

FIGS. 1A-1B illustrate cross-sectional views of example structures of uncoupled magnetic core devices 100A and 100B having a 3-dimensional (3-D) helical coil and a 3-D magnetic-flux closed circuit in accordance with one or more implementations of the subject technology. The uncoupled magnetic core device (hereinafter "device") 100A includes a substrate 110, a first magnetic shell 120 formed on the substrate 110, and a first group of conductive (e.g., copper) traces 140 embedded in a first insulator layer 142 formed on the first magnetic shell 120. The device 100A further includes a magnetic core plane 130 formed on the first insulator layer 142, a second group of conductive (e.g., copper) traces 144 embedded in a second insulator layer 146 formed on the magnetic core plane 130, and a second magnetic shell 122 formed on the second insulator layer 146. In some implementations, the substrate is formed of alumina ceramic ($Al_2O_3$), silicon, glass, or similar materials, and the insulating layers 142 and 146 can be made, for example, of hard resist or other insulating materials.

The first and second group of conductive traces 140 and 144 are horizontal parallel conductive traces, which are conductively coupled to one another, by using conductive vias, to form the 3-D helical coil that winds around the magnetic core plane 130. In one or more implementations, the cross-sectional area of the first and second group of conductive traces 140 and 144 can vary between 1×1 µm$^2$, for low-current applications, and 10×10 µm$^2$, for high-current applications. In some aspects, the subject technology allows formation of inductors as small as approximately 3×3×5 µm (height×width×length) formed, for example, by 1×1 µm$^2$ conductors as a single-round coil, and as large as 65×65×500 µm formed, for example, by 10×10 µm$^2$ conductors as a 5-rounds coil.

The 3-D magnetic-flux closed circuit is formed by the first and second magnetic shells 120 and 122, the magnetic core plane 130, and vertical magnetic vias 150, which can be formed by, for example, ferric material such as Fe—Ni or Ni—Fe and Co—Fe, or other magnetic materials. The first and second magnetic shells 120 and 122 sandwich the conductor coils to minimize magnetic flux leakage and improve a Q factor of the inductor of device 100A. The magnetic vias complete the closed-loop magnetic flux interconnection between the magnetic core plane 130 and the first and second magnetic shells 120 and 122.

In one or more implementations, as shown in FIG. 1B, the magnetic core plane 132 of the device 100B is laminated, for example, by forming the magnetic core plane 132 by multiple layers of magnetic material separated from one another by insulator layers (e.g., hard resist or other insulating materials). In some aspects, the magnetic core plane 132 includes a large number (e.g., >10) of laminated magnetic layers with thickness of the order of 0.1-0.4 µm. The laminated structure of the core plane 132 improves the device performance by reducing eddy current through the core plane 132, which can result in lower energy loss. In some implementations, similar to the core plane 132, the first and second magnetic shells 120 and 122 can also have laminated structures to further improve performance of the device 100B.

FIGS. 1C-1D illustrate additional cross-sectional views 100C and 100D of the example structure of uncoupled magnetic core device 100A of FIG. 1A in accordance with one or more implementations of the subject technology. The cross section view 100C shown in FIG. 1C depicts the conductor (e.g., copper) vias 160 that couple the first group of conductive traces 140, which are seen as slanted lines, to the second group of conductive traces 144 (not seen in the cross-sectional view 100C). Also seen in the cross-sectional view 100C are the magnetic vias 150 and insulator layers 170. In some implementations, the magnetic core plane 130 of FIG. 1A can be further slotted into strips to reduce in-plane eddy current formation to reduce energy loss. The insulator layers 170 are used to fill the gaps formed between the strips of the magnetic core plane. The cross-sectional view 100D shows two similar 3-D magnetic core devices each enclosed in a separate closed magnetic flux circuit formed by magnetic vias 150.

Figure 2C:
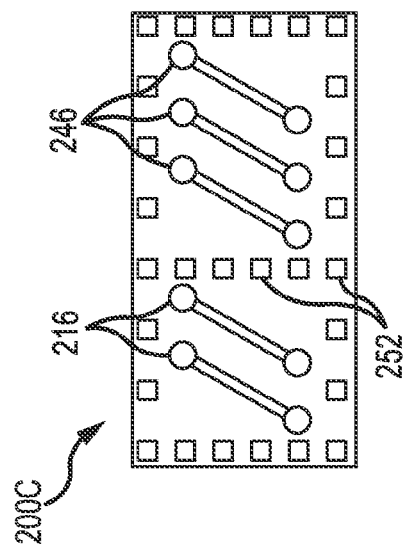
Figure 2A:
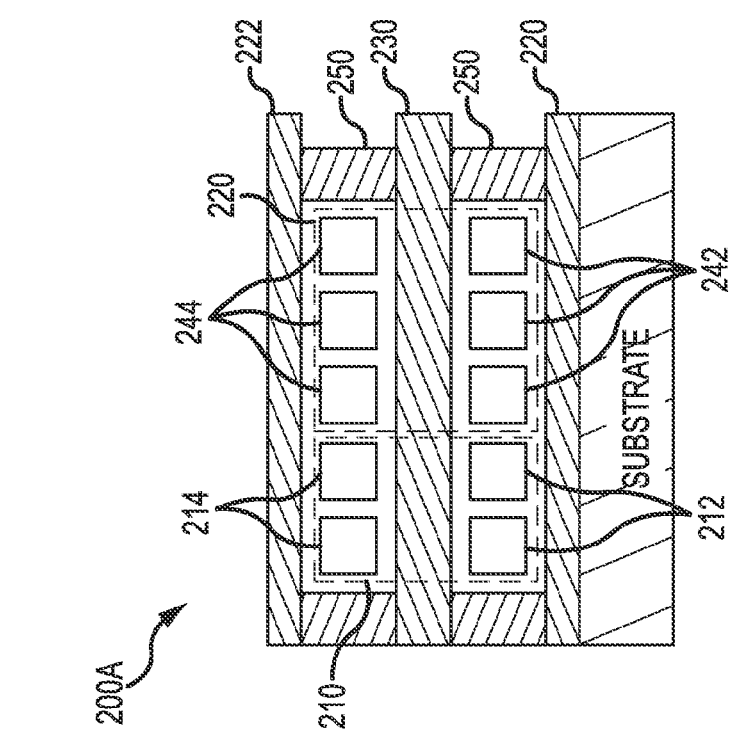

FIGS. 2A through 2C illustrate cross-sectional views of example structures of a magnetic core device including coupled inductors in accordance with one or more implementations of the subject technology. The cross-sectional view 200A shows the magnetic core device with coupled inductors (e.g., 3-D helical coils) 210 and 220. The 3-D helical coil 210 is formed by the inter-coupling of conductive traces 212 and 214 through conductive vias 216 illustrated in FIG. 2C. The 3-D helical coil 220 is formed by the inter-coupling of conductive traces 242 and 244 through conductive vias 246 illustrated in FIG. 2C. The 3-D helical coils 210 and 220 are magnetically coupled via 3-D magnetic-flux closed circuits and respectively form the primary and secondary coils of a transformer. The number of turns of the primary and secondary coils 210 and 220 can be the same or different. The 3-D magnetic-flux closed circuits that magnetically couple the primary and secondary coils 210 and 220 include magnetic shells 220 and 222, magnetic core plate 230, and magnetic vias 250.

In some implementations, the magnetic core plate 230 can be laminated and or slotted as described with respect to FIGS. 1B and 1C. For example, the magnetic core plate 230 can include a large number (e.g., >10) of laminated magnetic layers with thickness of the order of 0.1-0.2 µm. The laminated structure of the core plane 230 can improve the device performance by reducing eddy current through the core plane 230, which can result in lower energy loss. In some implementations, similar to the core plane 130, the magnetic shells 220 and 222 can also have laminated structures to further improve performance of the magnetic core device of FIG. 2A.

In one or more implementations, as shown in the cross-sectional view 200B of FIG. 2B, the primary and secondary coils 210 and 220 can be separated by the magnetic vias 252, which partition the 3-D magnetic-flux closed circuit into two different enclosed circuits. The implementation of the vias 252 is more clearly shown in the cross-sectional view 200C, which is similar to the cross-sectional view 100C of FIG. 1C, described above.

Figure 3:
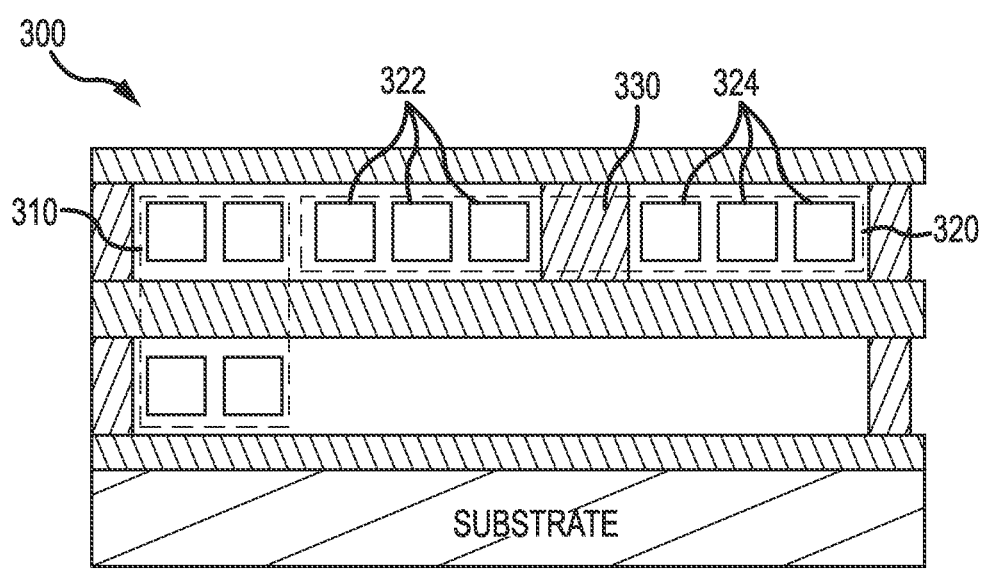
FIG. 3 illustrates a cross-sectional view of an example structure of hybrid coupled magnetic core devices having a 3-D helical coil and a 2-D spiral coil in accordance with one or more implementations.

FIG. 3 illustrates a cross-sectional view 300 of an example structure of hybrid coupled magnetic core devices having a 3-D helical coil and a 2-D spiral coil in accordance with one or more implementations of the subject technology. The magnetic core device with coupled inductors shown in the cross-sectional view 300 is similar to the magnetic core device shown in FIG. 2B, except that the first and second group of conductive traces 322 and 324 of the secondary coil 320 are formed in a same plane so that magnetic fields generated by the primary coil 310 and the secondary coil 320 are not parallel as in the case shown in FIG. 2B, but are substantially perpendicular to one another. This configuration of combining a 3-D helical coil 310 with a 2-D spiral coil 320 provides a difference in coupling characteristics, which can be useful in certain applications, where minimizing coupling is desirable. The coupling between the primary coil 310 and the secondary coil 320 can be adjusted, for example, by changing the thickness of the magnetic block 330 between the first and second group of conductive traces 322 and 324. In other words, the combination of the 3D helical coil 310 and the 2-D spiral coil 320 provides an opportunity for have a tunable magnetic coupling between the primary coil 310 and the secondary coil 320.

Figure 4A:
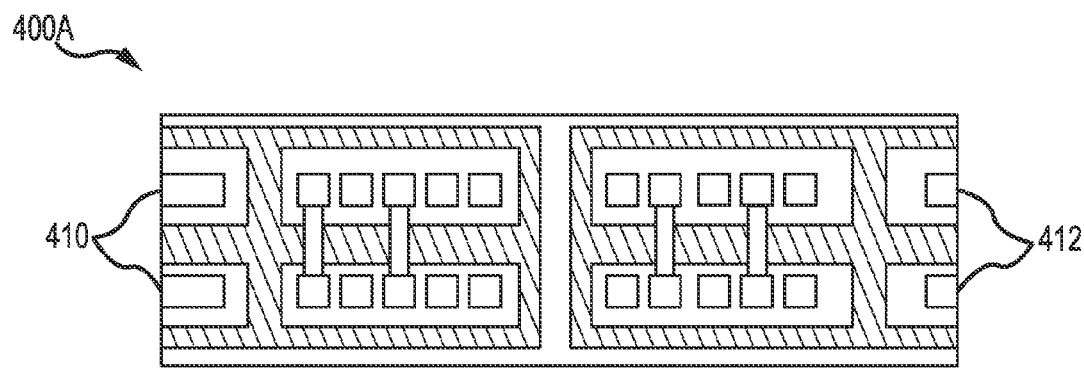
FIGS. 4A-4B illustrate examples of inductor input/output (I/O) architectures in accordance with one or more implementations.
Figure 4B:
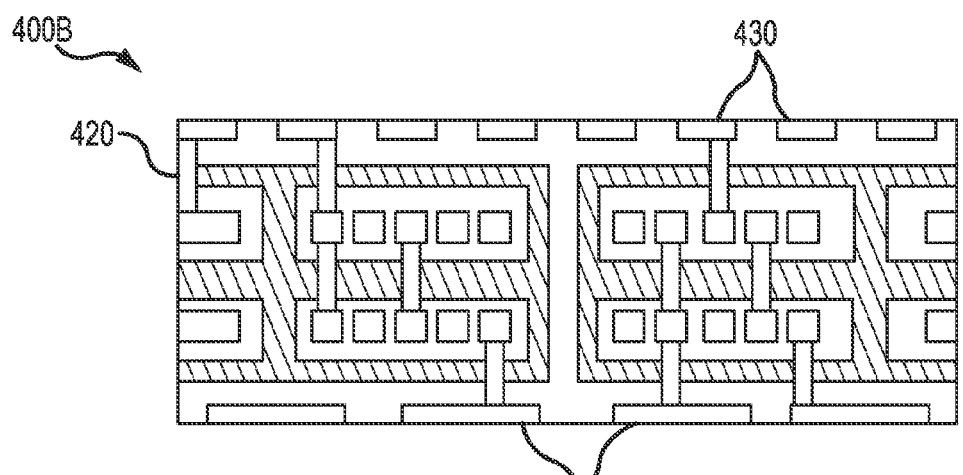

FIGS. 4A-4B illustrate examples of inductor input/output (I/O) architectures 400A and 400B in accordance with one or more implementations of the subject technology. Implementation of the existing 2-D inductor devices limits input/output (I/O) contact pads and/or pins to be on the same surface of the inductor device. The subject technology, advantageously allows the I/O contact pads and/or pins of the device be positioned on more than one surface of the device. For example, as shown in the I/O architecture 400A, the IO contact pads 410 and 412 are positioned on opposite surfaces of the inductor device. The I/O contact pads and/or pins, according to the subject technology, can be placed on any or the entire multiple (e.g., 6) surfaces of the device. For example, as shown in the I/O architecture 400B, the IO contact pads 420, 430, and 440 are positioned on top, side, and bottom surfaces of the inductor device. In some aspects, the inductor device can be integrated in an interposer having a two-dimensional (2D) array of input/output (IO) connections, and the interposer can include a high-density die-to-die interconnection bus for coupling to a plurality of chips.

FIGS. 5A through 5C illustrate examples of integrated inductor and capacitor filters in accordance with one or more implementations of the subject technology. In some implementations, one or more 3-D capacitors can be integrated with the one or more 3-D magnetic core device. For example, as shown in the cross-sectional view 500A of FIG. 5A, the capacitor 520 is integrated with the 3-D inductor 510. The 3-D inductor 510 is formed by the conductors 514 and the magnetic core 512, as discussed above. In some implementations, a ceramic material 530 (e.g., aluminum oxide) is used as the insulating material. The capacitor 520 is formed by conductive electrodes 524, connected to one another by conductive vias 526, and insulator layers formed by tantalum oxide layers 522 and the ceramic material 530. In one or more implementations, other insulator materials such as teflon can be used instead or in combination with the ceramic material. In some aspects, as shown in the cross-sectional view 500B of FIG. 5B, the capacitor 550 may be formed by using just one type of insulator, for example, the ceramic material 530. In some implementations, as shown in the cross-sectional view 500C of FIG. 5C, the capacitor 560 includes additional electrodes 580 formed by conductive layers in the same plane as the magnetic material layers 512.

Figure 6D:
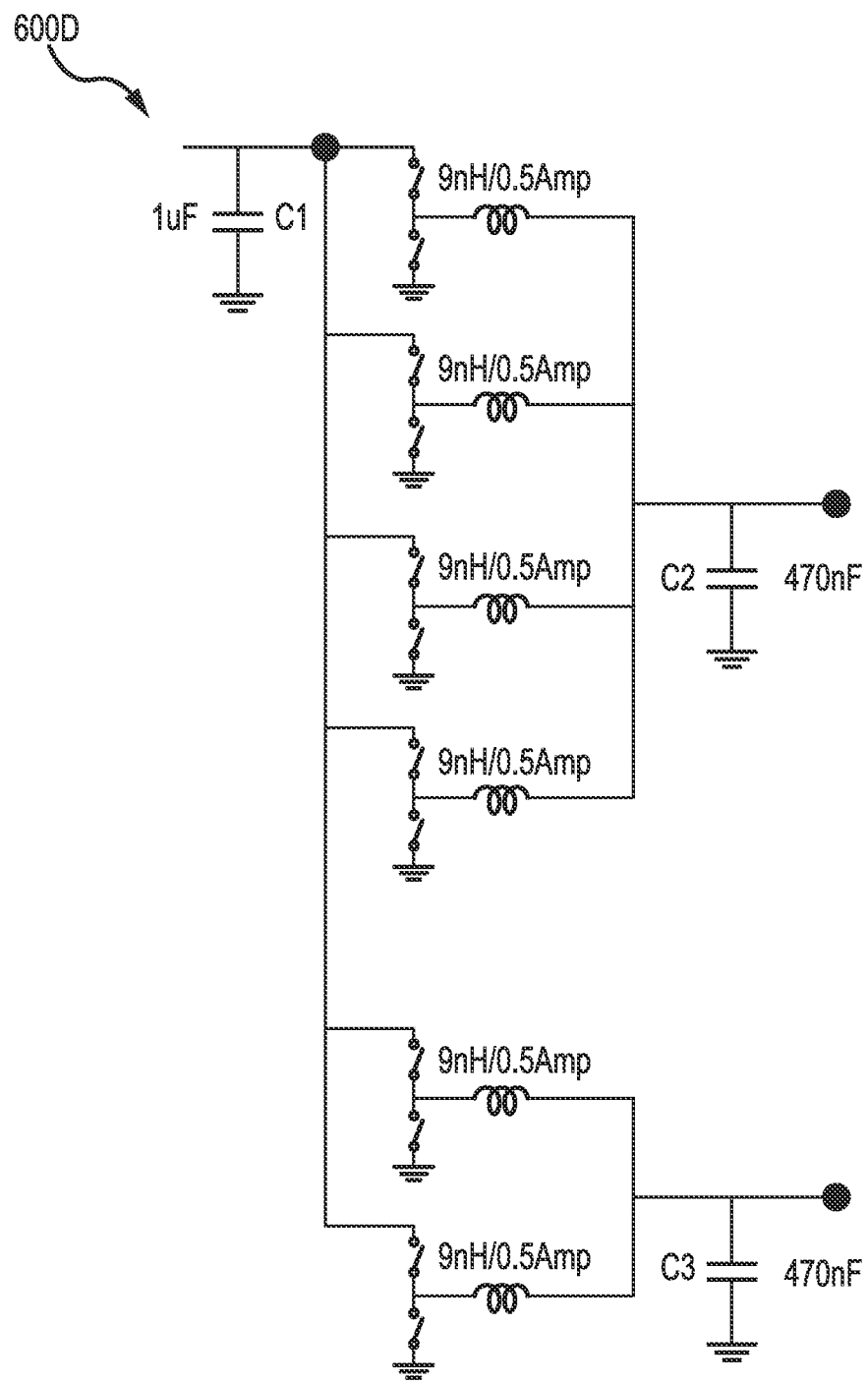

FIGS. 6A through 6D illustrate examples of applications of a 3-D magnetic core device in accordance with one or more implementations of the subject technology. The circuits 600A-through 600C shown in FIGS. 6A through 6C depict various filters that can be formed by various interconnections of capacitors C with the integrated 3-D inductors L of the subject technology, as described above. The integrated capacitor and the 3-D inductors can be coupled in parallel (e.g., as shown in FIG. 6A) or in series (e.g., as shown in FIG. 6B) or other configurations (e.g., as shown in FIG. 6C) to achieve different known filter functions. In some implementations, integrated 3-D inductors and capacitors can be interconnected to form switching regulators (e.g., circuit 600D shown in FIG. 6D). For example, the capacitors C1 at the input of the switching regulator circuit 600D or capacitors C2 and C3 connected to the outputs of the switching regulator circuit 600D can be integrated with inductors, as explained above.

FIGS. 7A through 7E illustrate examples of integrated inductors and capacitors into a passive device package (PDP) in accordance with one or more implementations of the subject technology. The PDP 710 shown in FIG. 7A includes multiple magnetic core inductors of the subject technology integrated with one or more capacitors. The PDP 710 can be a ball grid array (BGA) or land grid array (LGA) surface mount PDP having an array of electrically conductive balls 712 on the bottom surface for interconnection to another PDP, an interposer, or an integrated circuit (IC) packaging substrate. The PDP 720, as shown in FIG. 7B has electrical interconnect contact terminals 722 on the top of the PDP forming an array of contact terminals 722 with a pattern matching the array of balls 712. In one or more implementations, the contact terminals 722 can be made of an electrically conductive material and can be of any shape, for example, circular, rectangular, square, hexagonal, etc. Multiple PDPs 720 can be coupled to one another by mounting on the top of one another as shown in FIG. 7C and interconnecting through the array of balls 712 and the array of contact terminals 722. In one or more implementations, a PDP 730, as shown in FIG. 7D has multiple electrically conductive interconnect pads 732 on one or more side walls. The interconnect pads 732 are useful for coupling two or more PDP 730 together, as shown in FIG. 7E.

FIGS. 8A through 8D illustrate examples of apparatuses 800A through 800D using packaging integration of magnetic core inductors in accordance with one or more implementations of the subject technology. The apparatus 800A of FIG. 8A includes an IC packaging substrate 820 and an active chip 840 coupled to the IC packaging substrate 820 via an array of BGA or LGA formed of balls 846 that are electrically connected to contact terminals 848. The active chip 840 includes an active portion 842 that includes active and passive electronic circuitry such as analog and/or digital circuitry. The IC packaging substrate 820 includes a core 822 and multiple top re-distribution layers (RDLs) (e.g., metal layers) 824 and multiple bottom RDLs 826. In one or more implementations of the subject technology, a discrete magnetic core 830 is embedded in the core 822 of the IC packaging substrate 820. The discrete magnetic core 830 can be, for example, a traditionally used surface mounting magnetic core inductor. This integration technique can employ the same manufacturing flow used for integrating surface mount discrete capacitors in the core of an IC packaging substrate. For example, the discrete magnetic core 830 can be coupled to the active chip 840 through vias 832 in the RDLs 824 and contact terminals 848.

Figure 8A:
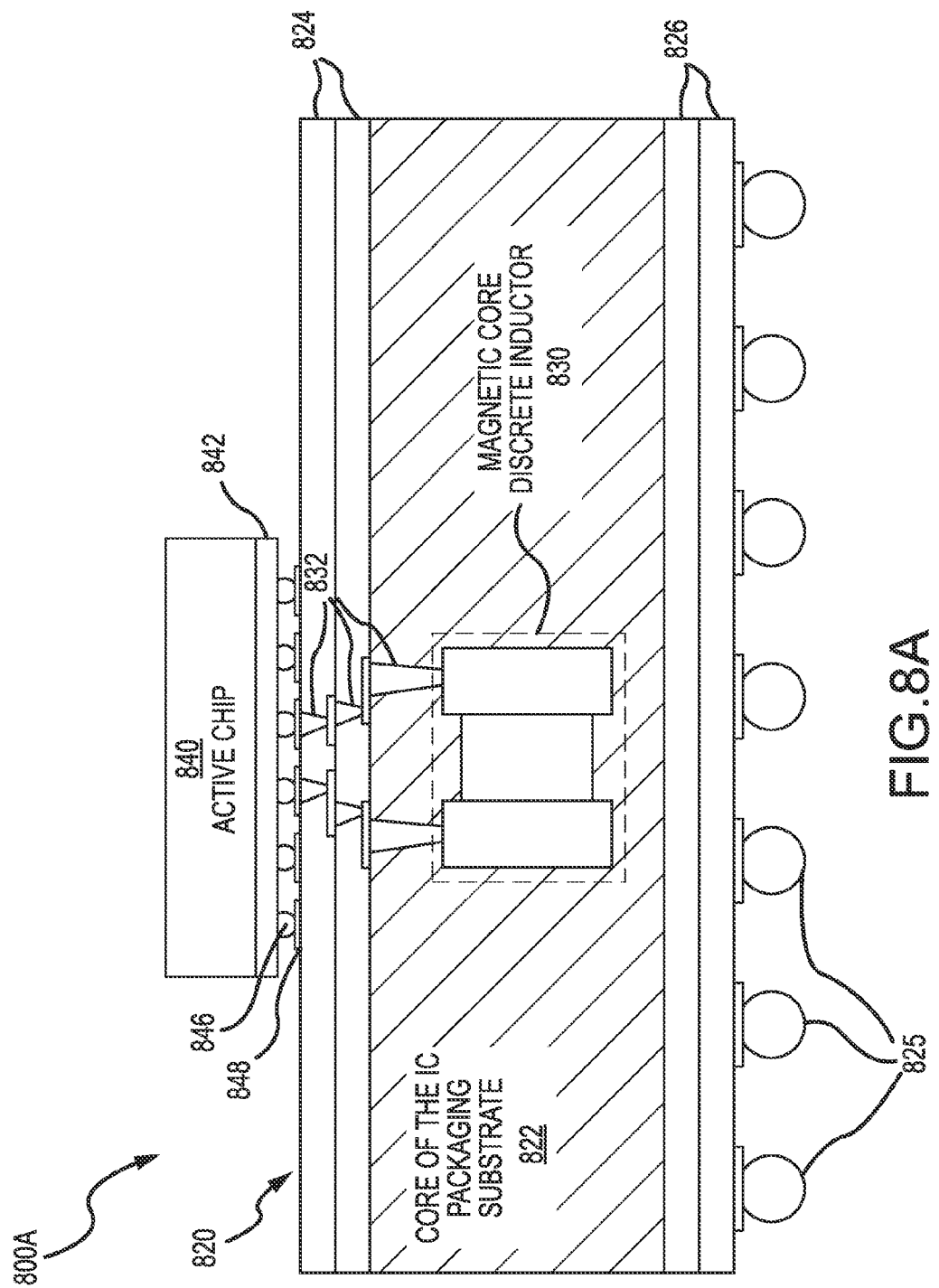
FIGS. 8A through 8E illustrate examples of apparatuses using packaging integration of magnetic core inductors in accordance with one or more implementations.
Figure 8B:
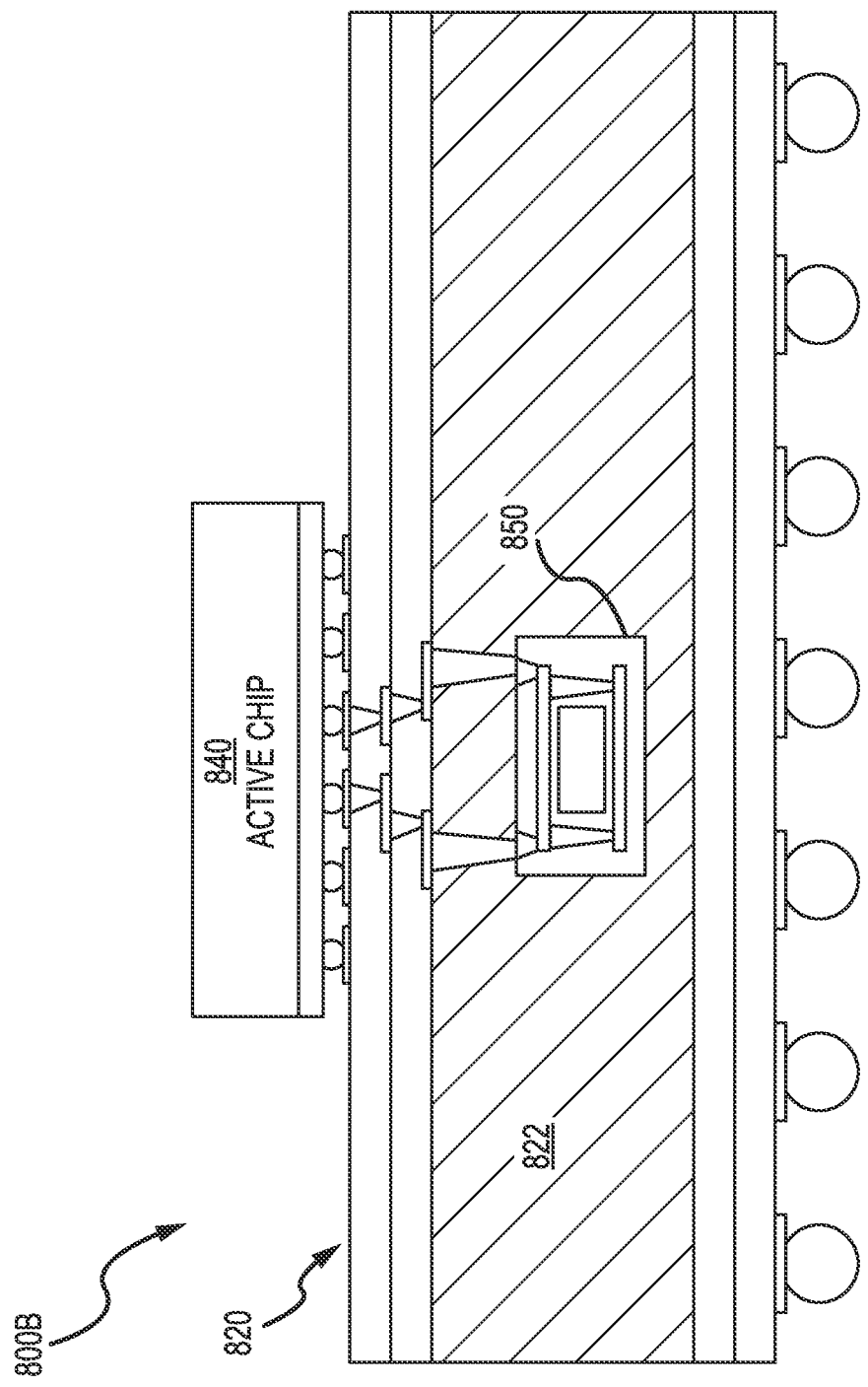

The apparatus 800B shown in FIG. 8B is similar to the apparatus 800A of FIG. 8A, except for the discrete magnetic core 830, which is replaced with a high-density magnetic core inductor 850, realized on a silicon substrate and embedded in the core 822 of the IC packaging substrate 820. Examples of the magnetic core inductor 850 include the magnetic core devices disclosed above, such as the magnetic core devices 100A, 100B, 200A, 200B, and 300 of FIGS. 1A, 1B, 2A, 2B, and 3, respectively. The coupling of the discrete magnetic core 830 to the active chip 840 is similar to the coupling of the discrete magnetic core 850 to the active chip 840 in FIG. 8A. In one or more implementations, embedding of magnetic core material on a silicon substrate can be done using a cavity in that silicon substrate or in the RDLs on top of that silicon substrate. Due to the high density nature of the metallization on a Silicon substrate, large value inductors can be realized on such inductors for a given footprint and profile.

Figure 8C:
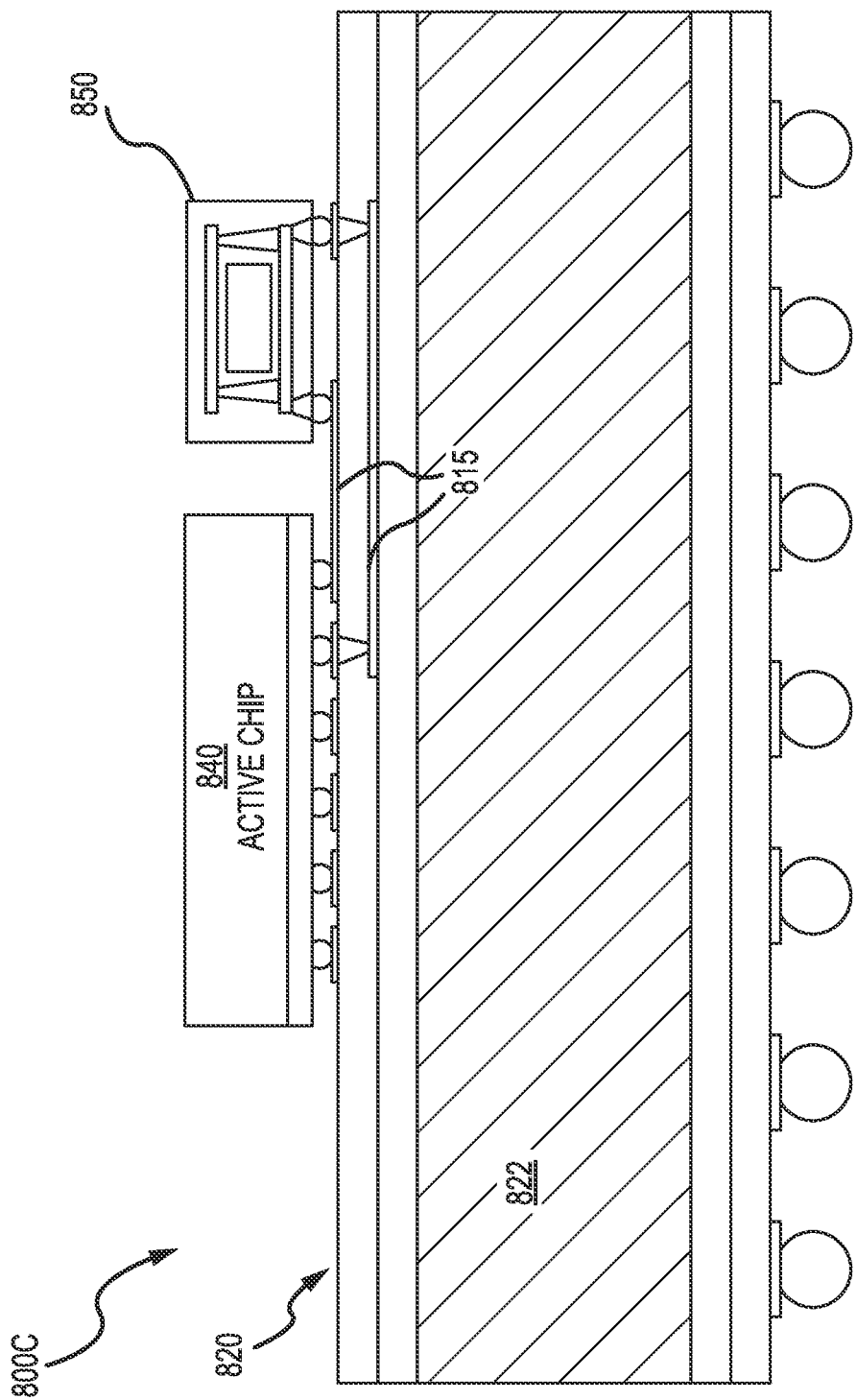

The apparatus 800C shown in FIG. 8C is similar to the apparatus 800B of FIG. 8B, except that the magnetic core inductor 850 is not embedded in the core 822 of the IC packaging substrate 820, and instead is mounted on the IC packaging substrate 820. The magnetic core inductor 850 is mounted side-by-side with the active chip 840 on the top surface of the IC packaging substrate 820, and coupled to the active chip 840 through interconnections 815. Due to the low profile of the Silicon based magnetic core inductors 850, such integration is not expected to cause other issues such as height mismatch impacting heart-spreader or heat-sink mounting.

Figure 8D:
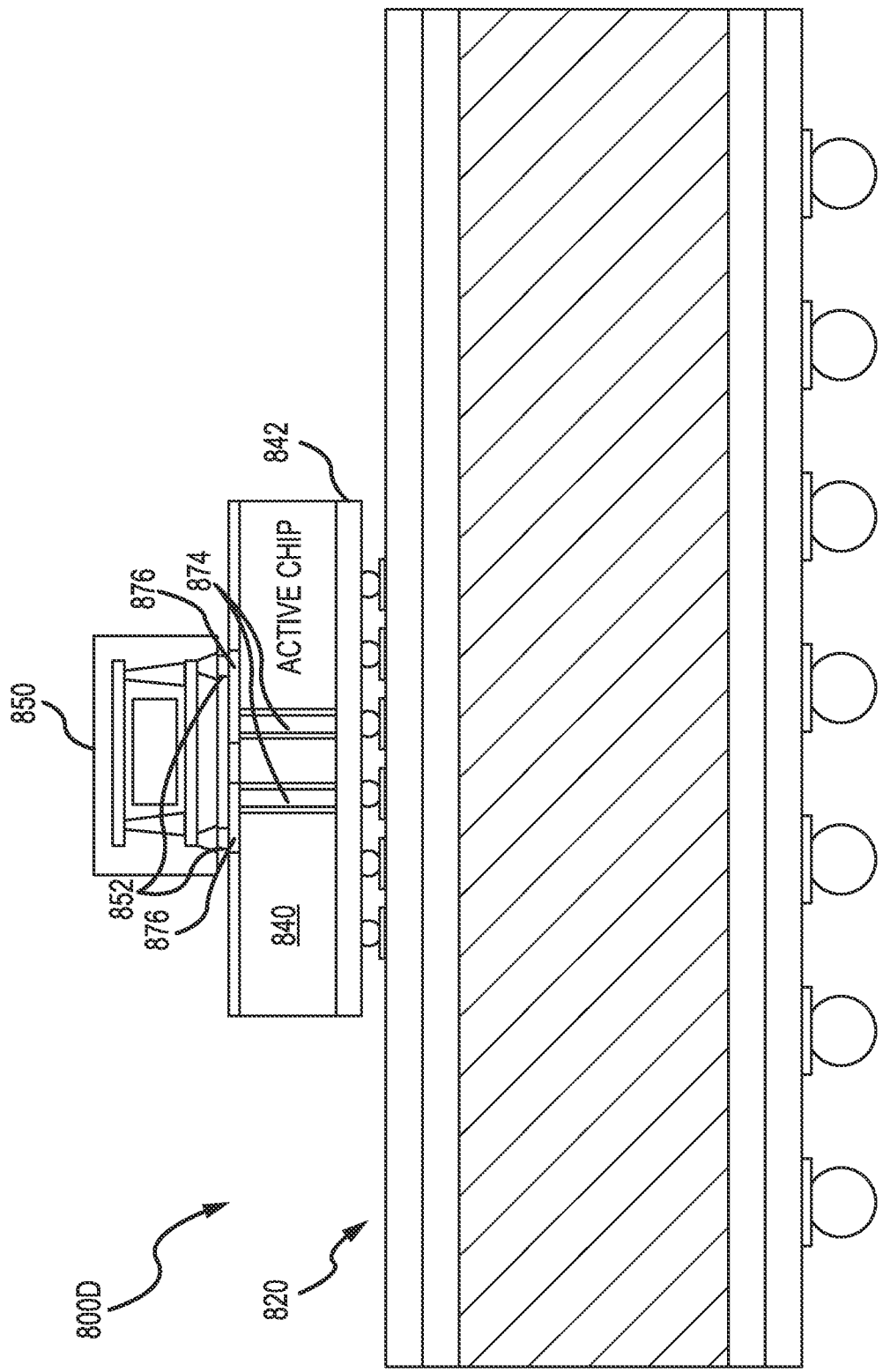

In the apparatus 800D shown in FIG. 8D, the active chip 840 and the IC packaging substrate 820 are similar to those of the apparatus 800C of FIG. 8C, except that the active chip 840 includes vias 874 and contact terminals 876 that allow the magnetic core inductor 850, mounted on top of the active chip 840, be coupled to the active portion 842 of the active chip 840. The magnetic core inductor 850 is coupled to the contact terminals 876 through micro-bumps 852. The 3-D stacking shown in FIG. 8D provides a path of least amount of parasitics from the magnetic core inductor 850 to the active circuitry of the active chip 840.

Figure 8E:
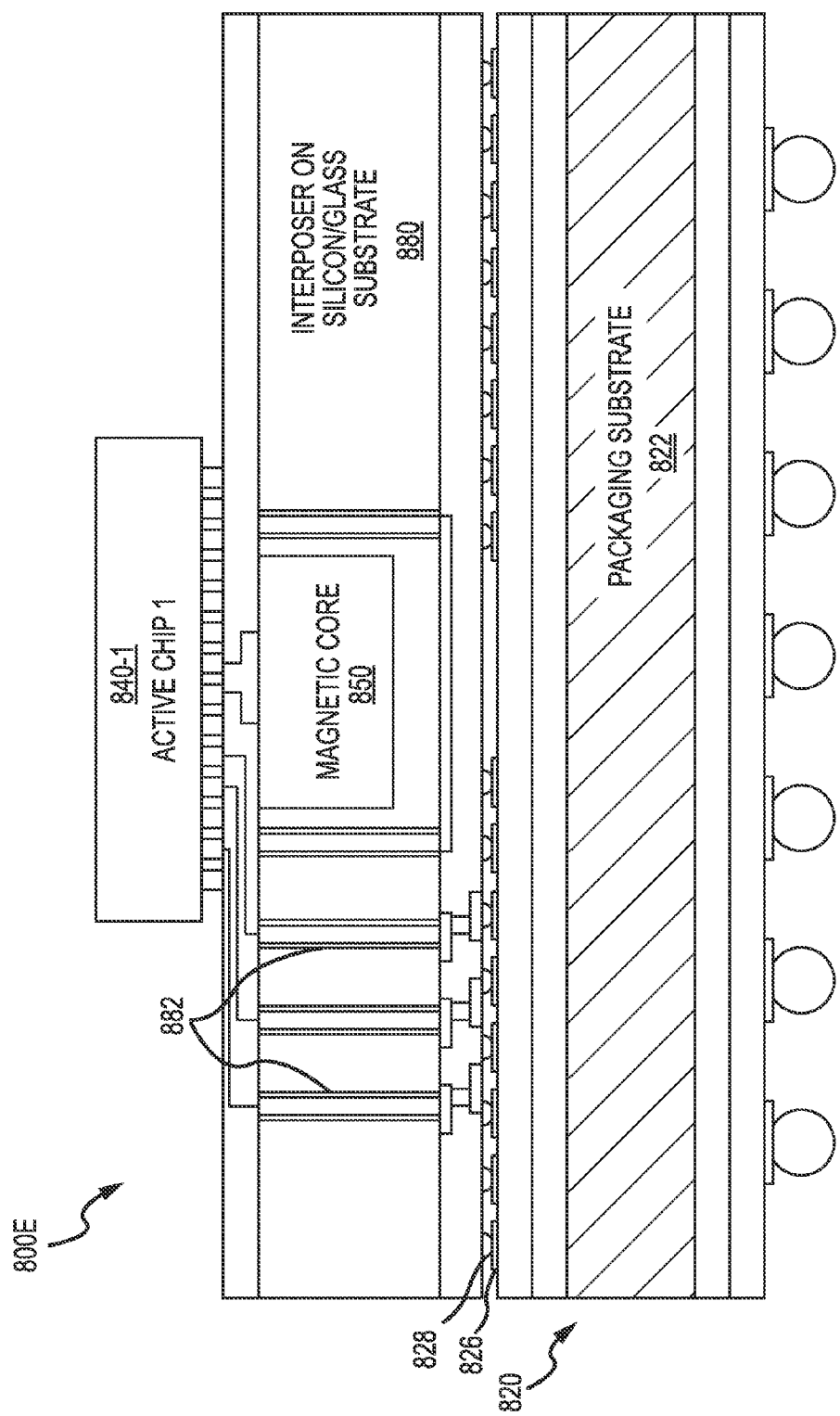

In the apparatus 800E shown in FIG. 8E, the active chip 840-1 and the IC packaging substrate 820 are similar to those of FIG. 8C. In the apparatus 800E, the high value inductor is realized on a silicon or glass interposer 880 that is inserted in between the active chip 840-1 and the IC packaging substrate 820. The magnetic core inductor 850 is inserted in the interposer 880 by creating a cavity in the interposer 880 or in the top or bottom RDLs of the interposer 880. The active chip 840-1 can be one of several active chips mounted on the interposer 880. The active chip 840-1 is coupled to the IC packaging substrate 820 through vias 882 passing through the interposer 880. The magnetic core inductor 850 inserted in the cavity of the interposer 880, the conductors that turn around that magnetic core inductor 850, include the top and bottom RDL turns and vias (e.g., 882) on the sides of the magnetic core inductor 850.

The subject technology, as described above, advantageously provides ways of increasing inductance density for a given surface area on the IC packaging substrate, by realizing the inductor around magnetic core material. The disclosed technology offers many advantages for applications such as voltage regulator output filtering, with devices having integrated on-chip voltage regulators. Such integration allows saving a multiple routing layers on the IC packaging substrate that are otherwise used for patterning the inductors.

Figure 9:
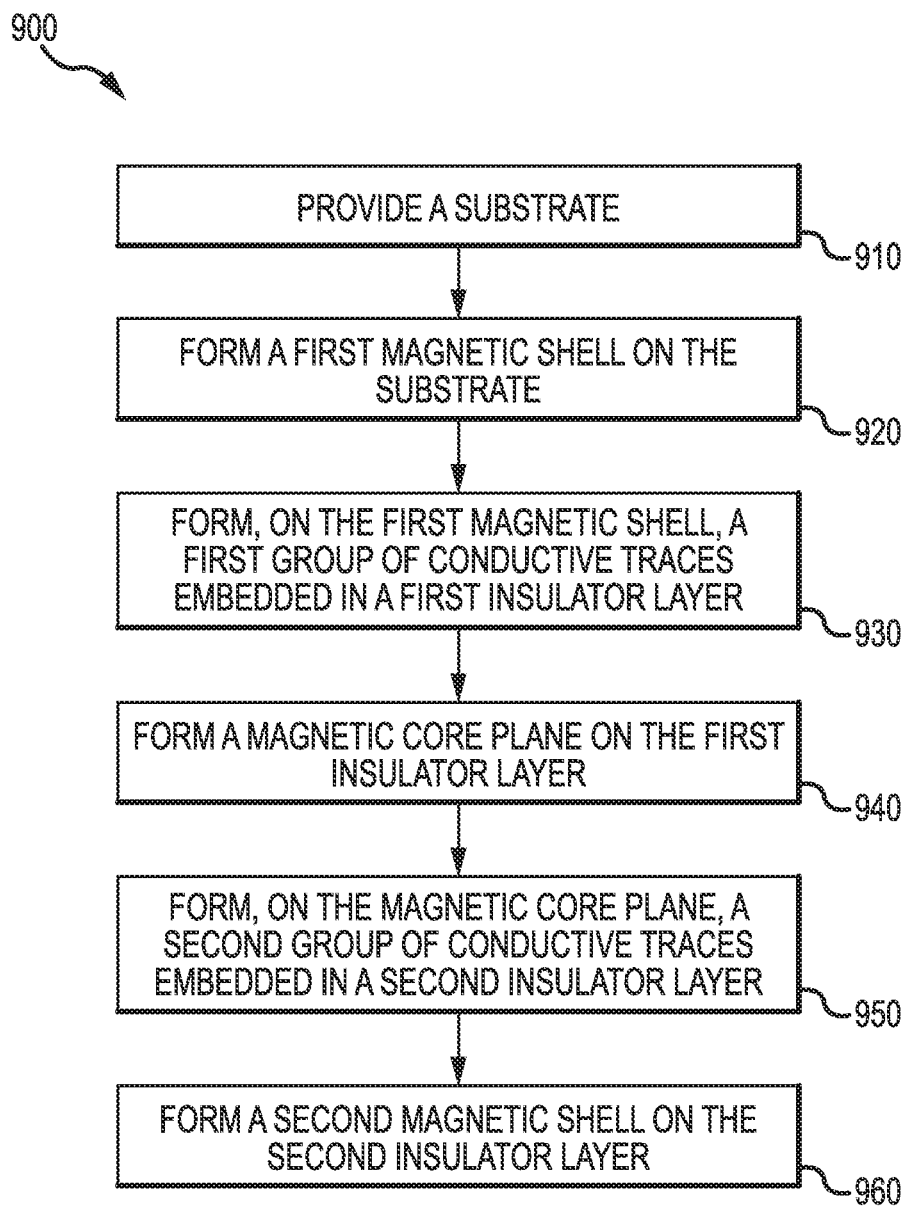
FIG. 9 illustrates an example of a method for providing a 3-D magnetic core device in accordance with one or more implementations.

FIG. 9 illustrates an example of a method 900 for providing a 3-D magnetic core device in accordance with one or more implementations of the subject technology. For explanatory purposes, the blocks of the example method 900 are described herein as occurring in serial, or linearly. However, multiple blocks of the example method 900 can occur in parallel. In addition, the blocks of the example method 900 need not be performed in the order shown and/or one or more of the blocks of the example method 900 need not be performed.

According to the method 900, a substrate (e.g., 110 of FIG. 1A) is provided (910). A first magnetic shell (e.g., 120 of FIG. 1A) is formed on the substrate (920). On the first magnetic shell, a first group of conductive traces (e.g., 140 of FIG. 1A) embedded in a first insulator layer (e.g., 142 of FIG. 1A), is formed (930). A magnetic core plane (e.g., 130 of FIG. 1A) is formed on the first insulator layer (940). A second group of conductive traces (e.g., 144 of FIG. 1A) embedded in a second insulator layer (e.g., 146 of FIG. 1A) are formed on the magnetic core plane (950). A second magnetic shell (e.g., 122 of FIG. 1A) is formed on the second insulator layer (960).

Figure 10:
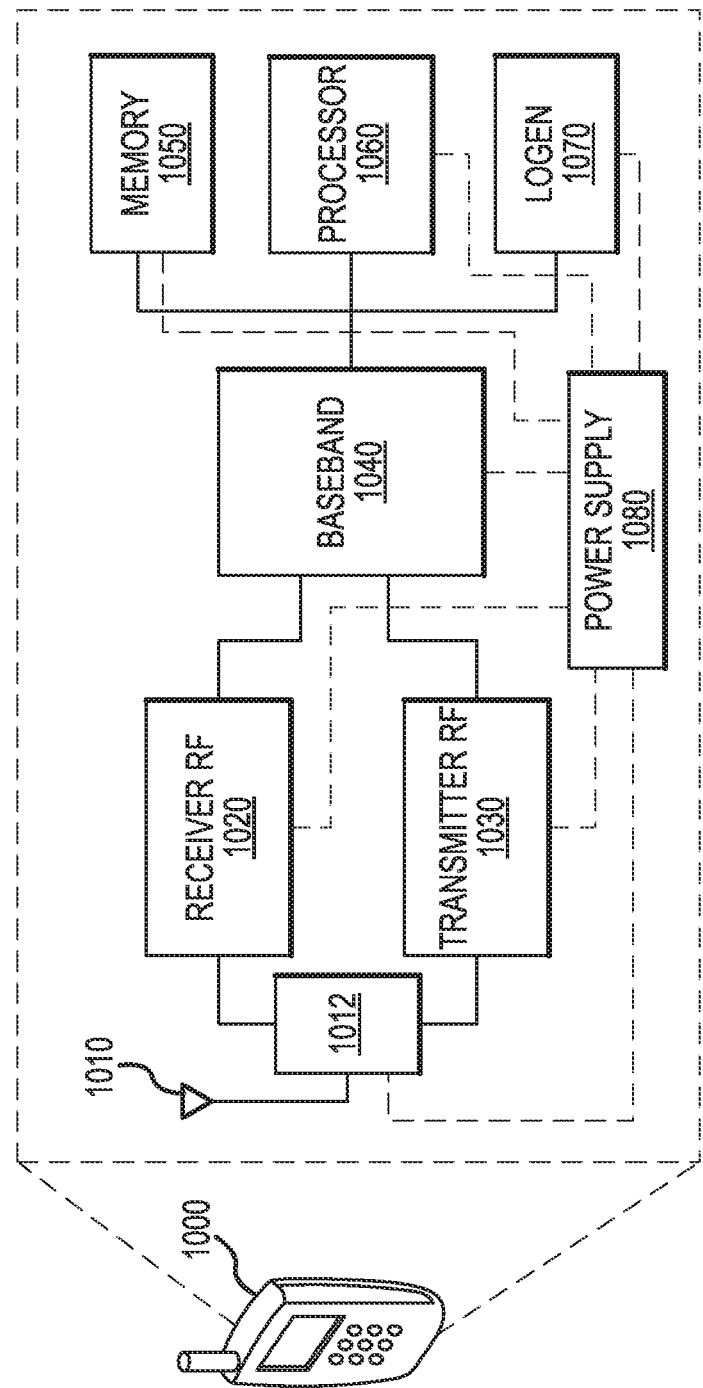
FIG. 10 illustrates an example of a wireless communication device employing features of the subject technology in accordance with one or more implementations.

FIG. 10 illustrates an example of a wireless communication device employing features of the subject technology in accordance with one or more implementations of the subject technology. The wireless communication device 1000 includes a radio-frequency (RF) antenna 1010, a receiver 1020, a transmitter 1030, a baseband processing module 1040, a memory 1050, a processor 1060, a local oscillator generator (LOGEN) 1070, a power supply 1080 and a sensor module 1090. In various embodiments of the subject technology, one or more of the blocks represented in FIG. 10 can be integrated on one or more semiconductor substrates. For example, the blocks 1020-1070 can be realized in a single chip or a single system on chip, or can be realized in a multi-chip chipset.

The RF antenna 1010 can be suitable for transmitting and/or receiving RF signals (e.g., wireless signals) over a wide range of frequencies. Although a single RF antenna 1010 is illustrated, the subject technology is not so limited.

The receiver 1020 comprises suitable logic circuitry and/or code that can be operable to receive and process signals from the RF antenna 1010. The receiver 1020 may, for example, be operable to amplify and/or down-convert received wireless signals. In various embodiments of the subject technology, the receiver 1020 is operable to cancel noise in received signals and can be linear over a wide range of frequencies. In this manner, the receiver 1020 is suitable for receiving signals in accordance with a variety of wireless standards. Wi-Fi, WiMAX, Bluetooth, and various cellular standards.

The transmitter 1030 comprises suitable logic circuitry and/or code that can be operable to process and transmit signals from the RF antenna 1010. The transmitter 1030 may, for example, be operable to up-convert baseband signals to RF signals and amplify RF signals. In various embodiments of the subject technology, the transmitter 1030 is operable to up-convert and to amplify baseband signals processed in accordance with a variety of wireless standards. Examples of such standards include Wi-Fi, WiMAX, Bluetooth, and various cellular standards. In various embodiments of the subject technology, the transmitter 1030 is operable to provide signals for further amplification by one or more power amplifiers.

The duplexer 1012 provides isolation in the transmit band to avoid saturation of the receiver 1020 or damaging parts of the receiver 1020, and to relax one or more design requirements of the receiver 1020. Furthermore, the duplexer 1012 can attenuate the noise in the receive band. The duplexer is operable in multiple frequency bands of various wireless standards.

The baseband processing module 1040 comprises suitable logic, circuitry, interfaces, and/or code that can be operable to perform processing of baseband signals. The baseband processing module 1040 may, for example, analyze received signals and generate control and/or feedback signals for configuring various components of the wireless communication device 1000 such as the receiver 1020. The baseband processing module 1040 is operable to encode, decode, transcode, modulate, demodulate, encrypt, decrypt, scramble, descramble, and/or otherwise process data in accordance with one or more wireless standards.

The processor 1060 comprises suitable logic, circuitry, and/or code that can enable processing data and/or controlling operations of the wireless communication device 1000. In this regard, the processor 1060 is enabled to provide control signals to various other portions of the wireless communication device 1000. The processor 1060 can also control transfers of data between various portions of the wireless communication device 1000. Additionally, the processor 1060 can enable implementation of an operating system or otherwise execute code to manage operations of the wireless communication device 1000.

The memory 1050 comprises suitable logic, circuitry, and/or code that can enable storage of various types of information such as received data, generated data, code, and/or configuration information. The memory 1050 includes, for example, RAM, ROM, flash, and/or magnetic storage. In various embodiment of the subject technology, the memory 1050 may include a RAM, DRAM, SRAM, T-RAM, Z-RAM, TTRAM, or any other storage media.

The local oscillator generator (LOGEN) 1070 comprises suitable logic, circuitry, interfaces, and/or code that can be operable to generate one or more oscillating signals of one or more frequencies. The LOGEN 1070 can be operable to generate digital and/or analog signals. In this manner, the LOGEN 1070 can be operable to generate one or more clock signals and/or sinusoidal signals. Characteristics of the oscillating signals such as the frequency and duty cycle can be determined based on one or more control signals from, for example, the processor 1060 and/or the baseband processing module 1040.

In operation, the processor 1060 can configure the various components of the wireless communication device 1000 based on a wireless standard according to which it is desired to receive signals. Wireless signals can be received via the RF antenna 1010 and amplified and down-converted by the receiver 1020. The baseband processing module 1040 can perform noise estimation and/or noise cancellation, decoding, and/or demodulation of the baseband signals. In this manner, information in the received signal can be recovered and utilized appropriately. For example, the information can be audio and/or video to be presented to a user of the wireless communication device, data to be stored to the memory 1050, and/or information affecting and/or enabling operation of the wireless communication device 1000. The baseband processing module 1040 can modulate, encode and perform other processing on audio, video, and/or control signals to be transmitted by the transmitter 1030 in accordance to various wireless standards.

In some implementations of the subject technology, at least some of circuits of the wireless communication device 1000, for example, some modules and/or components of the receiver 1020 and transmitter 1030 can be implemented using the uncoupled (e.g., magnetic core devices of FIGS. 1A and 1B) or coupled 3-D inductors (e.g., magnetic core devices of FIGS. 2A and 2B) of the subject technology to form of various filters (e.g., filters of FIGS. 6A through 6C). The power supply 1080 may, for example, use switching regulators that can be formed by interconnection integrated capacitors with the 3-D inductors of the subject technology (e.g., switching regulator of FIG. 6D), as explained above.

Those of skill in the art would appreciate that the various illustrative blocks, modules, elements, components, and methods described herein can be implemented as electronic hardware, computer software, or combinations of both. To illustrate this interchangeability of hardware and software, various illustrative blocks, modules, elements, components, and methods have been described above generally in terms of their functionality. Whether such functionality is implemented as hardware or software depends upon the particular application and design constraints imposed on the overall system. Skilled artisans can implement the described functionality in varying ways for each particular application. Various components and blocks can be arranged differently (e.g., arranged in a different order, or partitioned in a different way) all without departing from the scope of the subject technology.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

A phrase such as "an aspect" does not imply that such aspect is essential to the subject technology or that such aspect applies to all configurations of the subject technology. A disclosure relating to an aspect can apply to all configurations, or one or more configurations. An aspect can provide one or more examples of the disclosure. A phrase such as an "aspect" refers to one or more aspects and vice versa. A phrase such as an "embodiment" does not imply that such embodiment is essential to the subject technology or that such embodiment applies to all configurations of the subject technology. A disclosure relating to an embodiment can apply to all embodiments, or one or more embodiments. An embodiment can provide one or more examples of the disclosure. A phrase such an "embodiment" can refer to one or more embodiments and vice versa. A phrase such as a "configuration" does not imply that such configuration is essential to the subject technology or that such configuration applies to all configurations of the subject technology. A disclosure relating to a configuration can apply to all configurations, or one or more configurations. A configuration can provide one or more examples of the disclosure. A phrase such as a "configuration" can refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein can be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A 3-dimensinal (3-D) magnetic core device, the device comprising:
   a substrate;
   a first magnetic shell formed on the substrate;
   a first group of conductive traces embedded in a first insulator layer formed on the first magnetic shell;
   a magnetic core plane formed on the first insulator layer;
   a second group of conductive traces embedded in a second insulator layer formed on the magnetic core plane; and
   a second magnetic shell formed on the second insulator layer,
   wherein the first and second group of conductive traces are conductively coupled by using conductive vias, and wherein the first and second magnetic shells and the magnetic core plane are magnetically coupled by using magnetic vias.

2. The device of claim 1, wherein the first and second group of conductive traces comprise horizontal parallel conductive traces, and wherein the horizontal parallel conductive traces comprise copper traces.

3. The device of claim 2, wherein the conductive vias are configured to form a first helical coil around the magnetic core plane.

4. The device of claim 1, wherein the magnetic core plane comprises a laminated magnetic core, and wherein the magnetic core plane is slotted into a plurality of strips to reduce eddy current.

5. The device of claim 1, wherein the first and second group of conductive traces and the conductive vias form a primary coil of a transformer, and wherein a secondary coil of the transformer is structurally similar to the primary coil.

6. The device of claim 5, wherein counts of turns of the primary and secondary coils are different, and wherein the primary and secondary coils are formed side-by-side.

7. The device of claim 6, wherein the first and second group of conductive traces of the secondary coil are formed in a same plane so that magnetic fields generated by the first and second coils are substantially perpendicular to one another.

8. The device of claim 1, wherein input/output (IO) contact pads are positioned on more than one surface of the device, wherein the IO contact pads are positioned on opposite surfaces of the device, wherein the IO contact pads are positioned on any of multiple surfaces of the device.

9. The device of claim 1, wherein the device is integrated in an interposer having a two-dimensional (2D) array of input/output (IO) connections, wherein the interposer includes a high-density die-to-die interconnection bus for coupling to a plurality of chips, and wherein the device further comprises one or more 3-D capacitors coupled to the 3-D magnetic core device.

10. The device of claim 1, wherein:
    the device is integrated in a passive device package (PDP),
    the device is integrated with one or more capacitors in the PDP,
    the PDP comprises a surface-mount (SMT) PDP,
    the PDP comprises a ball grid array BGA or a land grid array (LGA) PDP,
    the PDP comprises electrical interconnect contacts on at least one of a top surface or a sidewall of the PDP, and
    two or more PDPs are coupled by at least one of surface mounting on top of one another or by side-by-side interconnection.

11. The device of claim 1, wherein the device is integrated in one of following configurations:
    the device is integrated in a core of an integrated circuit (IC) packaging substrate and is coupled to an active chip through metal layers on top of the core of the IC packaging;
    the device is mounted on an IC packaging substrate and coupled to an active chip mounted on the IC packaging substrate;
    the device is integrated on a top of an active chip mounted on a an IC packaging substrate and is coupled to an active portion of the active chip through vias; or
    the device is integrated in an interposer coupled to an IC packaging substrate and an active chip is mounted over the interposer and is coupled to the IC packaging substrate using vias passing through the interposer.

12. A method for providing a 3-dimensinal (3-D) magnetic core device, the method comprising:
    providing a substrate;
    forming a first magnetic shell on the substrate;
    forming, on the first magnetic shell, a first group of conductive traces embedded in a first insulator layer;
    forming a magnetic core plane on the first insulator layer;
    forming, on the magnetic core plane, a second group of conductive traces embedded in a second insulator layer;
    forming a second magnetic shell on the second insulator layer; and
    magnetically coupling the first and second magnetic shells and the magnetic core plane by using magnetic vias.

13. The method of claim 12, further comprising conductively coupling the first and second group of conductive traces by using conductive vias, wherein forming the first and second group of conductive traces comprises forming horizontal parallel conductive traces, and wherein forming the horizontal parallel conductive traces comprises forming copper traces.

14. The method of claim 13, further comprising configuring the conductive vias to form a first helical coil around the magnetic core plane.

15. The method of claim 12, wherein the magnetic core plane comprises a laminated magnetic core, and wherein the method further comprises slotting the magnetic core plane into a plurality of strips to reduce eddy current.

16. The method of claim 12, further comprising:
forming a primary coil of a transformer by using the first and second group of conductive traces and the conductive vias, and
forming a secondary coil of the transformer structurally similar to the primary coil.

17. The method of claim 16, wherein counts of turns of the primary and secondary coils are different, and the method further comprises forming the primary and secondary coils side-by-side.

18. The method of claim 17, further comprising forming the first and second group of conductive traces of the secondary coil in a same plane so that magnetic fields generated by the first and second coils are substantially perpendicular to one another.

19. The method of claim 12, further comprising:
positioning input/output (IO) contact pads on more than one surface of the device,
positioning the IO contact pads on opposite surfaces of the device, and
positioning the IO contact pads on any of multiple surfaces of the device.

20. The method of claim 12, further comprising integrating the 3-D magnetic core device in an interposer having a two-dimensional (2D) array of input/output (IO) connections, and coupling one or more 3-D capacitors to the 3-D magnetic core device, wherein the interposer includes a high-density die-to-die interconnection bus for coupling to a plurality of chips.

21. The method of claim 12, further comprising integrating the 3-D magnetic core device in a passive device package (PDP), wherein:
the 3-D magnetic core device is integrated with one or more capacitors in the PDP,
the PDP comprises a surface-mount (SMT) PDP,
the PDP comprises a ball grid array BGA or a land grid array (LGA) PDP,
the PDP comprises electrical interconnect contacts on at least one of a top surface or a sidewall of the PDP, and
the method further comprises coupling two or more PDPs by at least one of surface mounting on top of one another or by side-by-side interconnection.

22. The method of claim 12, further comprising one of:
integrating the 3-D magnetic core device in a core of an integrated circuit (IC) packaging substrate and coupling the 3-D magnetic core device to an active chip through metal layers on top of the core of the IC packaging;
mounting the 3-D magnetic core device on an IC packaging substrate and coupling the 3-D magnetic core device to an active chip mounted on the IC packaging substrate;
integrating the 3-D magnetic core device on a top of an active chip mounted on an IC packaging substrate and coupling the 3-D magnetic core device to an active portion of the active chip through vias; or
integrating the 3-D magnetic core device in an interposer coupled to an IC packaging substrate and mounting an active chip over the interposer and coupling the active chip to the IC packaging substrate using vias passing through the interposer.

23. A communication device, comprising:
a radio-frequency (RF) circuitry configured to communicate RF signals; and
one or more wireless chargers or one or more RF filters, wherein at least one of the one or more wireless chargers or the one or more RF filters comprises a 3-dimensinal (3-D) magnetic core device, the magnetic core device comprising:
a substrate;
a first magnetic shell formed on the substrate;
a first group of conductive traces embedded in a first insulator layer formed on the first magnetic shell;
a magnetic core plane formed on the first insulator layer;
a second group of conductive traces embedded in a second insulator layer formed on the magnetic core plane; and
a second magnetic shell formed on the second insulator layer,
wherein the first and second group of conductive traces are conductively coupled by using conductive vias.

24. The communication device of claim 23, wherein:
the first and second group of conductive traces comprise horizontal parallel conductive traces,
the horizontal parallel conductive traces comprise copper traces,
the conductive vias are configured to form a first helical coil around the magnetic core plane,
the first and second magnetic shells and the magnetic core plane are magnetically coupled by using magnetic vias,
the magnetic core plane comprises a laminated magnetic core, and
the magnetic core plane is slotted into a plurality of strips to reduce eddy current.

* * * * *